United States Patent
Huang et al.

(10) Patent No.: US 8,237,238 B2
(45) Date of Patent: Aug. 7, 2012

(54) IMAGE SENSOR

(75) Inventors: Wei-Kuo Huang, Hsinchu (TW); Yu-Yuan Yao, Changhua County (TW)

(73) Assignee: Novatek Microelectronics Corp., Hsinchu (TW)

( * ) Notice: Subject to any disclaimer, the term of this patent is extended or adjusted under 35 U.S.C. 154(b) by 77 days.

(21) Appl. No.: 12/980,341

(22) Filed: Dec. 29, 2010

(65) Prior Publication Data

US 2012/0112304 A1 May 10, 2012

(30) Foreign Application Priority Data

Nov. 4, 2010 (TW) ................................ 99137998 A

(51) Int. Cl.
*H01L 31/00* (2006.01)
(52) U.S. Cl. ....................... 257/440; 257/436
(58) Field of Classification Search .......... 257/292–294, 257/432–446, E21.001, E31.003
See application file for complete search history.

(56) References Cited

U.S. PATENT DOCUMENTS

| | | | |
|---|---|---|---|
| 6,756,618 B2 * | 6/2004 | Hong | 257/292 |
| 7,388,187 B1 | 6/2008 | Liu et al. | |
| 7,687,837 B2 * | 3/2010 | Park et al. | 257/294 |
| 7,960,807 B2 * | 6/2011 | Lin et al. | 257/440 |
| 7,964,928 B2 * | 6/2011 | Roy et al. | 257/440 |
| 2008/0079045 A1 | 4/2008 | Bahl et al. | |
| 2010/0084692 A1 | 4/2010 | Mao et al. | |

\* cited by examiner

*Primary Examiner* — Cuong Q Nguyen
(74) *Attorney, Agent, or Firm* — Jianq Chyun IP Office

(57) ABSTRACT

An image sensor including a substrate, a deep well layer, multiple first sensing units, second sensing units and third sensing units is provided. The first, the second and the third sensing units are located between a first surface and the deep well layer. A ratio between an area of a part of the deep well layer under each first sensing unit and an area of each first sensing unit is a first area ratio. A ratio between an area of a part of the deep well layer under each second sensing unit and an area of each second sensing unit is a second area ratio. A ratio between an area of a part of the deep well layer under each third sensing unit and an area of each third sensing unit is a third area ratio. The first area ratio is greater than the second and the third area ratios.

16 Claims, 10 Drawing Sheets

IMAGE SENSOR

CROSS-REFERENCE TO RELATED APPLICATION

This application claims the priority benefit of Taiwan application serial no. 99137998, filed on Nov. 4, 2010. The entirety of the above-mentioned patent application is hereby incorporated by reference herein and made a part of this specification.

BACKGROUND

1. Field of the Invention

The invention relates to a sensor. Particularly, the invention relates to an image sensor.

2. Description of Related Art

Image sensors fabricated according to a semiconductor fabrication process can be used to sense light projected to a semiconductor substrate, for example, a complementary metal oxide semiconductor (CMOS) image sensor. These image sensors use a sensing unit array to receive light energy and convert the light energy into digital data. However, since absorption depths for a silicon substrate absorbing light of different wavelengths are different, different degrees of cross-talk problems exist between the sensing units. For example, the absorption depth for the silicon substrate absorbing 90% light intensity of a blue light (450 nm) is about 1 μm, and such depth range totally falls within an electric field range of the sensing units. However, absorption depths for the silicon substrate absorbing 90% light intensity of a green light (450 nm) and a red light (650 nm) are respectively 3.7 μm and 8 μm, and carriers generated in the deep of the silicon substrate due to the light are far away from the electric field range of the sensing units, and now a motion pattern of the carriers is diffusion, and the carriers might be absorbed by the adjacent sensing units of other colors. Therefore, the sensing unit of each color cannot only absorb the carriers generated by the light of the corresponding color, so that the color corresponding to a sensing result is incorrect.

SUMMARY OF THE INVENTION

The invention is directed to an image sensor, which can mitigate a cross-talk phenomenon between sensing units.

The invention is directed to a method for manufacturing an image sensor, by which a cross-talk phenomenon between sensing units of the image sensor can be mitigated.

The invention provides an image sensor including a substrate, a deep well layer, a plurality of first sensing units, a plurality of second sensing units and a plurality of third sensing units. The deep well layer is located in the substrate. The first sensing units, the second sensing units and the third sensing units are located between a first surface and the deep well layer of the substrate. A ratio between an area of a part of the deep well layer under each first sensing unit and an area of each first sensing unit is a first area ratio. A ratio between an area of a part of the deep well layer under each second sensing unit and an area of each second sensing unit is a second area ratio. A ratio between an area of a part of the deep well layer under each third sensing unit and an area of each third sensing unit is a third area ratio. The first area ratio is greater than the second area ratio and the third area ratio.

In an embodiment of the invention, a sensing wavelength of the first sensing unit is smaller than a sensing wavelength of the second sensing unit and a sensing wavelength of the third sensing unit.

In an embodiment of the invention, the second area ratio is greater than the third area ratio. Moreover, the sensing wavelength of the second sensing unit is smaller than the sensing wavelength of the third sensing unit.

In an embodiment of the invention, the image sensor further includes a filter layer disposed on the first surface of the substrate. The filter layer has a plurality of first filter units, a plurality of second filter units and a plurality of third filter units. Each of the first filter units is located above one of the first sensing units. Each of the second filter units is located above one of the second sensing units. Each of the third filter units is located above one of the third sensing units. Moreover, the first filter units are pervious to blue light, the second filter units are pervious to green light, and the third filter units are pervious to red light.

In an embodiment of the invention, the first area ratio is 1.

In an embodiment of the invention, each of the first sensing units, each of the second sensing units and each of the third sensing units respectively include a first type doped region and a plurality of second type doped wells located at two sides of the first type doped region. Moreover, the first type doped region is a N-type doped region, and the second type doped wells are P-type doped wells. Moreover, the deep well layer is a deep P-type doped well layer. In addition, any two of the adjacent first sensing units, the second sensing units and the third sensing units share one of the second type doped wells.

In an embodiment of the invention, the image sensor further includes a shallow trench isolation structure located in the substrate for isolating the first sensing units, the second sensing units and the third sensing units.

In an embodiment of the invention, the deep well layer is distributed under the first sensing units in a dot distribution.

In an embodiment of the invention, the deep well layer includes a plurality of strip parts parallel to each other.

In an embodiment of the invention, the deep well layer has a mesh shape, and the first sensing units, the second sensing units and the third sensing units are located above a plurality of meshes of the deep well layer.

In an embodiment of the invention, the image sensor further includes a surface doped layer located on the first surface of the substrate.

According to the above descriptions, in the image sensor of the invention, motions of the carriers are limited through a distribution manner of the deep well layer under the sensing units, so as to mitigate the cross-talk phenomenon between the sensing units.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
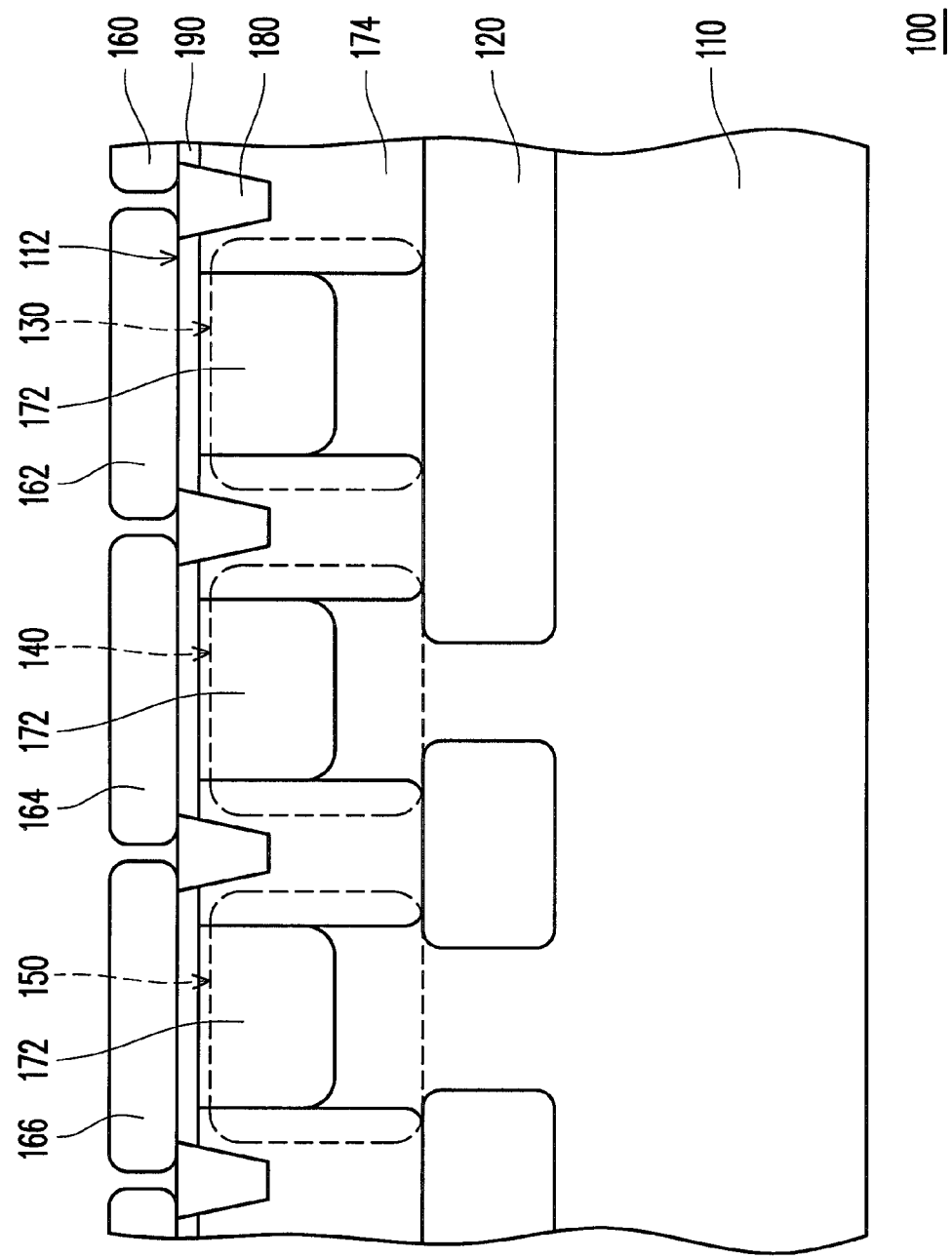
FIG. 1 is a cross-sectional view of an image sensor according to an embodiment of the invention.

FIG. 1 is a cross-sectional view of an image sensor according to an embodiment of the invention, in which sensing units used for sensing light of three different colors are illustrated in a same cross section for simplicity's sake, which does not represent an actual application situation. Referring to FIG. 1, the image sensor 100 of the present embodiment includes a substrate 110, a deep well layer 120, a plurality of first sensing units 130, a plurality of second sensing units 140 and a plurality of third sensing units 150. The deep well layer 120 is located in the substrate 110. The first sensing units 130, the second sensing units 140 and the third sensing units 150 are located between a first surface 112 and the deep well layer 120 of the substrate 110. Therefore, motions of carriers generated when light irradiates the sensing units 130, 140 and 150 are limited by the deep well layer 120.

A ratio between an area of a part of the deep well layer 120 under each first sensing unit 130 and an area of each first sensing unit 130 is a first area ratio. A ratio between an area of a part of the deep well layer 120 under each second sensing unit 140 and an area of each second sensing unit 140 is a second area ratio. A ratio between an area of a part of the deep well layer 120 under each third sensing unit 150 and an area of each third sensing unit 150 is a third area ratio. The first area ratio is greater than the second area ratio and is greater than the third area ratio. In other words, a proportion of the underneath of each first sensing unit 130 shielded by the deep well layer 120 is greater than a proportion of the underneath of each second sensing unit 140 shielded by the deep well layer 120, and is greater than a proportion of the underneath of each third sensing unit 150 shielded by the deep well layer 120. Here, a distribution area of the deep well layer 120 and the areas of the sensing units 130, 140 and 150 are defined as areas of the deep well layer 120 and the sensing units 130, 140 and 150 observed from a direction perpendicular to the first surface 112.

According to the above design, the deep well layer 120 may shield more carriers diffused from the second sensing unit 140 and the third sensing unit 150 towards the first sensing unit 130, so as to avoid distortion of a signal sensed by the first sensing unit 130. Therefore, the image sensor of the present embodiment may have a better accuracy.

In the present embodiment, a sensing wavelength of the first sensing unit 130 is smaller than a sensing wavelength of the second sensing unit 140 and a sensing wavelength of the third sensing unit 150, and the sensing wavelength of the second sensing unit 140 is, for example, smaller than the sensing wavelength of the third sensing unit 150. For example, the sensing wavelength of the first sensing unit 130 is 450 nm of the blue light, the sensing wavelength of the second sensing unit 140 is 550 nm of the green light, and the sensing wavelength of the third sensing unit 150 is 650 nm of the red light. Therefore, a depth underneath the third sensing unit 150 capable of generating the carriers is greater than a depth underneath the second sensing unit 140 capable of generating the carriers, and the depth underneath the second sensing unit 140 capable of generating the carriers is greater than a depth underneath the first sensing unit 130 capable of generating the carriers.

Moreover, in the present embodiment, the second area ratio is greater than the third area ratio, i.e. a number of the carriers shielded by the deep well layer 120 for the second sensing unit 140 is greater than a number of the carriers shielded by the deep well layer 120 for the third sensing unit 150. In this way, a chance that the carriers generated under the second sensing unit 140 and the third sensing unit 150 enter a sensing range of the first sensing unit 130 can be effectively reduced, so that besides the cross-talk phenomenon is reduced, light sensitivities of the second sensing unit 140 and the third sensing unit 150 are improved, and noise is reduced. Meanwhile, the light comes into the third sensing unit 150 has longer wavelength, such that the carriers are generated in a deeper place, and the carriers generated in the deeper place can not be controlled by the electric field range of the third sensing unit 150 easily. In order to increase the possibility of controlling the carriers generated in the deeper place, the area of the third sensing unit 150 shielded by the deep well layer 120 should be the smallest between three sensing units, and the possibility that the carriers generated under the third sensing unit 150 move to the first sensing unit 130 and the second sensing unit 140 can be decreased. Therefore, the first area ratio can even be set to 1, i.e. the underneath of the first sensing unit 130 is completely shielded by the deep well layer 120. In the present embodiment, when the distributions of the deep well layer 120 under the sensing units 130, 140 and 150 are mentioned, the area ratios are taken as comparison bases rather than only taking the areas of the deep well layer 120 as the comparison bases since the areas of the sensing units 130, 140 and 150 can be the same or different.

In order to control the wavelength of the light entering each of the sensing units 130, 140 and 150, the image sensor 100 may further include a filter layer 160 disposed on the first surface 112 of the substrate 110. The filter layer 160 has a plurality of first filter units 162, a plurality of second filter units 164 and a plurality of third filter units 166, though only a part of the filter units is illustrated in FIG. 1. Each of the first filter units 162 is located above one of the first sensing units 130. Each of the second filter units 164 is located above one of the second sensing units 140. Each of the third filter units 166 is located above one of the third sensing units 150. Moreover, the first filter units 162 are, for example, pervious to the blue light, the second filter units 164 are pervious to the green light, and the third filter units 166 are pervious to the red light.

In the present embodiment, each of the first sensing units 130, each of the second sensing units 140 and each of the third sensing units 150 respectively include a first type doped region 172 and a plurality of second type doped wells 174 located at two sides of the first type doped region 172. Moreover, the first type doped region 172 is, for example, a N-type doped region, and the second type doped wells 174 are P-type doped wells. Moreover, the deep well layer 120 is, for example, a deep P-type doped well layer. A part of the substrate 110 around each of the sensing units 130, 140 and 150 is, for example, P-type substrate. Certainly, types of the doped ions of the above devices can also be exchanged. In addition, any two of the adjacent first sensing units 130, the second sensing units 140 and the third sensing units 150 share one of the second type doped wells 174.

The image sensor 100 of the present embodiment further includes a shallow trench isolation structure 180 located in the substrate 110 for isolating the first sensing units 130, the second sensing units 140 and the third sensing units 150. The shallow trench isolation structure 180 can be a mesh, a plurality of strips parallel to each other, a plurality of short strips or any suitable shapes. The shallow trench isolation structure 180 is generally located on the first surface 112 of the substrate 110. Moreover, the image sensor 100 of the present embodiment further includes a surface doped layer 190 located on the first surface 112 of the substrate 110. A type of the doped ions of the surface doped layer 190 is, for example, the same to the type of the doped ions of the deep well layer 120 and the second type doped wells 174, but is different to the type of the doped ions of the first type doped region 172.

Figure 2A:
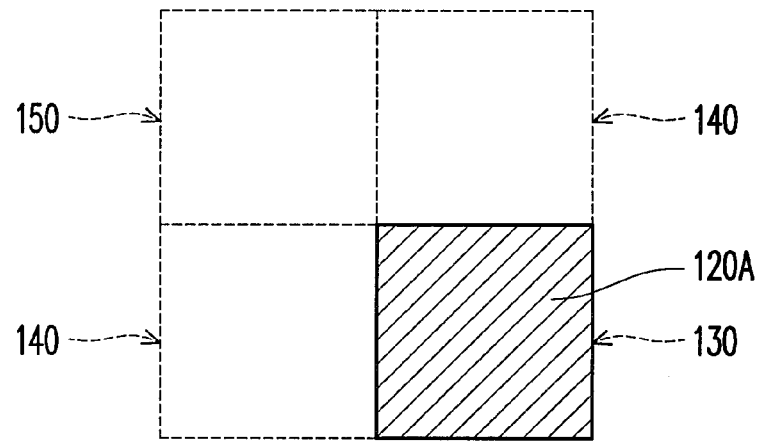
FIG. 2A to FIG. 2G are top views of seven implementations of the deep well layer.
Figure 2B:
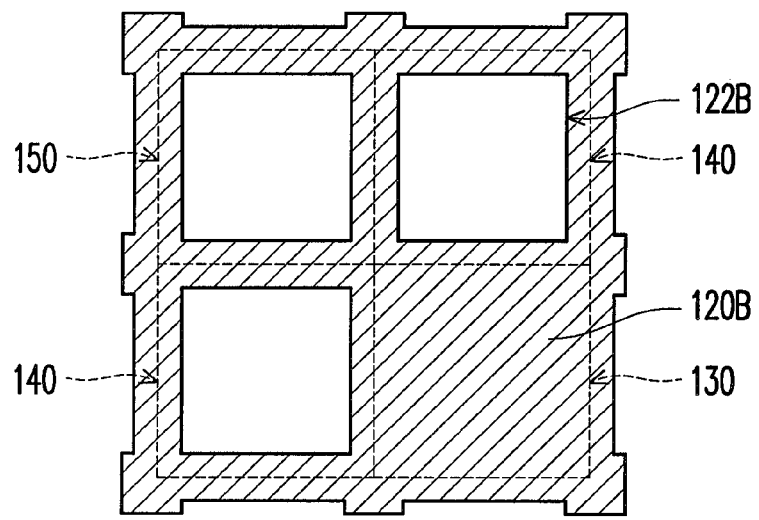
Figure 2C:
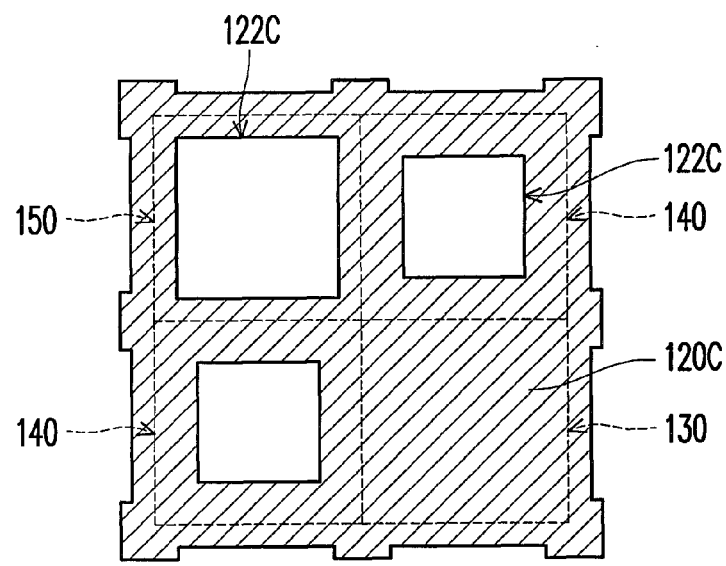

FIG. 2A to FIG. 2G are top views of seven implementations of the deep well layer. Referring to FIG. 2A, the deep well layer 120A of the present embodiment is distributed under the first sensing units 130 in a dot distribution, i.e. the deep well layer 120A is only distributed under the first sensing units 130. Referring to FIG. 2B, the deep well layer 120B of the present embodiment has a mesh shape, and the first sensing units 130, the second sensing units 140 and the third sensing units 150 are located above a plurality of meshes 122B of the deep well layer 120B. The meshes 122B are openings of the deep well layer 120B. In the present embodiment, the deep well layer 120B only has the meshes 122B under the second sensing units 140 and the third sensing units 150, and the underneath of the first sensing units 130 is still completely shielded by the deep well layer 120B. However, the deep well layer 120B may also have the meshes 122B under the first sensing units 130, though areas of the meshes 122B under the first sensing units 130 are smaller than that of the other meshes 122B. Referring to FIG. 2C, similar to the deep well layer 120B of FIG. 2B, the deep well layer 120C of the present embodiment also has the mesh shape, though areas of the meshes 122C under the second sensing units 140 are smaller than areas of the meshes 122C under the third sensing units 150.

Figure 2D:
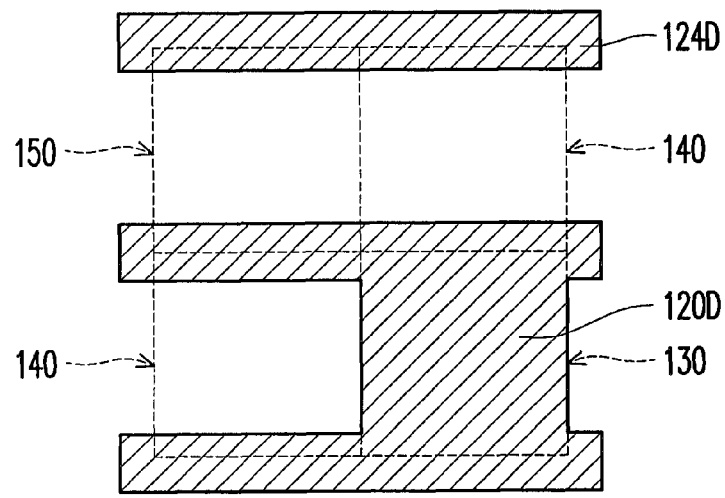
Figure 2E:
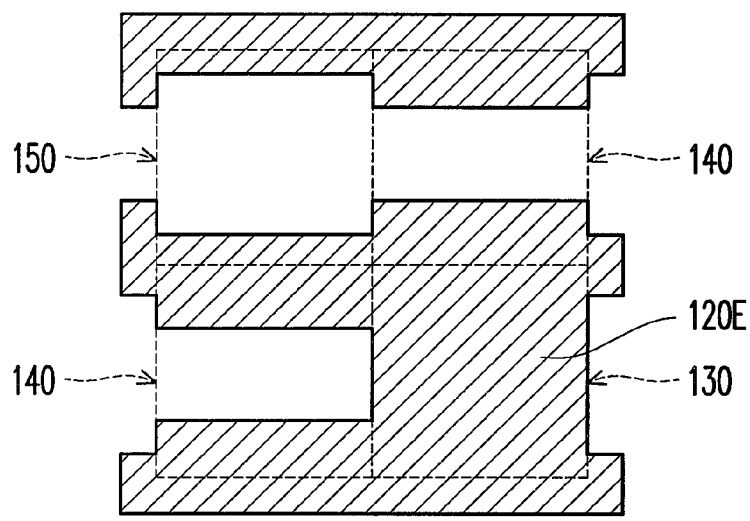
Figure 2F:
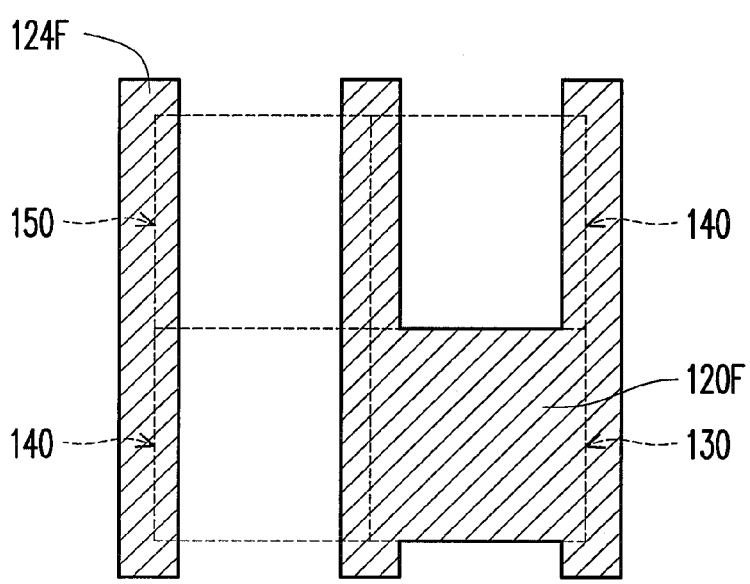
Figure 2G:
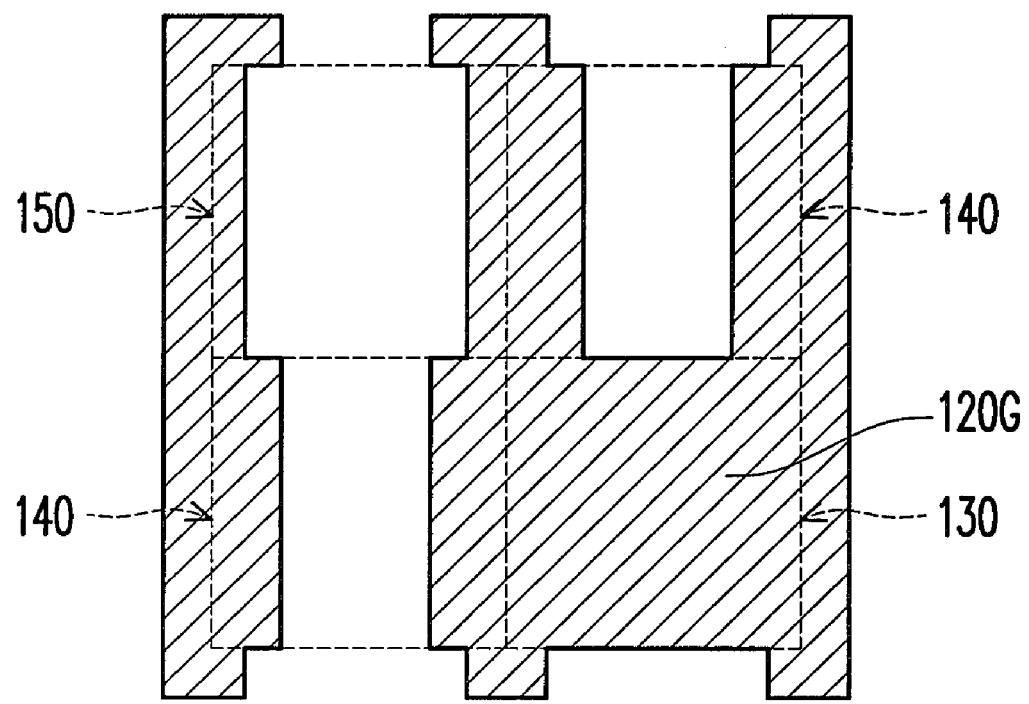

Referring to FIG. 2D, the deep well layer 120D of the present embodiment includes a plurality of strip parts 124D parallel to each other. The strip parts 124D are horizontally arranged in FIG. 2D, and the underneath of the first sensing units 130 is completely shielded by the deep well layer 120D. Referring to FIG. 2E, similar to the deep well layer 120D of FIG. 2D, the deep well layer 120E of the present embodiment also has the strip shape, though areas shielded by the deep well layer 120E under the second sensing units 140 are greater than areas shielded by the deep well layer 120E under the third sensing units 150. Referring to FIG. 2F, similar to the deep well layer 120D of FIG. 2D, the deep well layer 120F of the present embodiment also includes a plurality of strip parts 124F parallel to each other, though the strip parts 124F are vertically arranged in FIG. 2F. Referring to FIG. 2G, similar to the deep well layer 120F of FIG. 2F, the deep well layer 120G of the present embodiment also has the strip shape, though areas shielded by the deep well layer 120G under the second sensing units 140 are greater than areas shielded by the deep well layer 120G under the third sensing units 150.

FIG. 3 to FIG. 7 are partial cross-sectional views of a method for manufacturing an image sensor according to an embodiment of the invention. Referring to FIG. 1, the method for manufacturing the image sensor includes following steps. The deep well layer 120 is formed in the substrate 110. The first sensing units 130, the second sensing units 140 and the third sensing units 150 are formed between the first surface 112 and the deep well layer 120 of the substrate 110. Distributions of the deep well layer 120 and relationships of the sensing units 130, 140 and 150 are not repeated. The image sensor 100 manufactured according to the manufacturing method of the present embodiment may mitigate the cross-talk phenomenon and improve sensing accuracy.

A detailed flow of the method for manufacturing the image sensor of the present embodiment is described below, though the invention is not limited thereto. Moreover, a sequence of forming various devices of the present embodiment is not limited, which can also be suitably adjusted.

Figure 3:
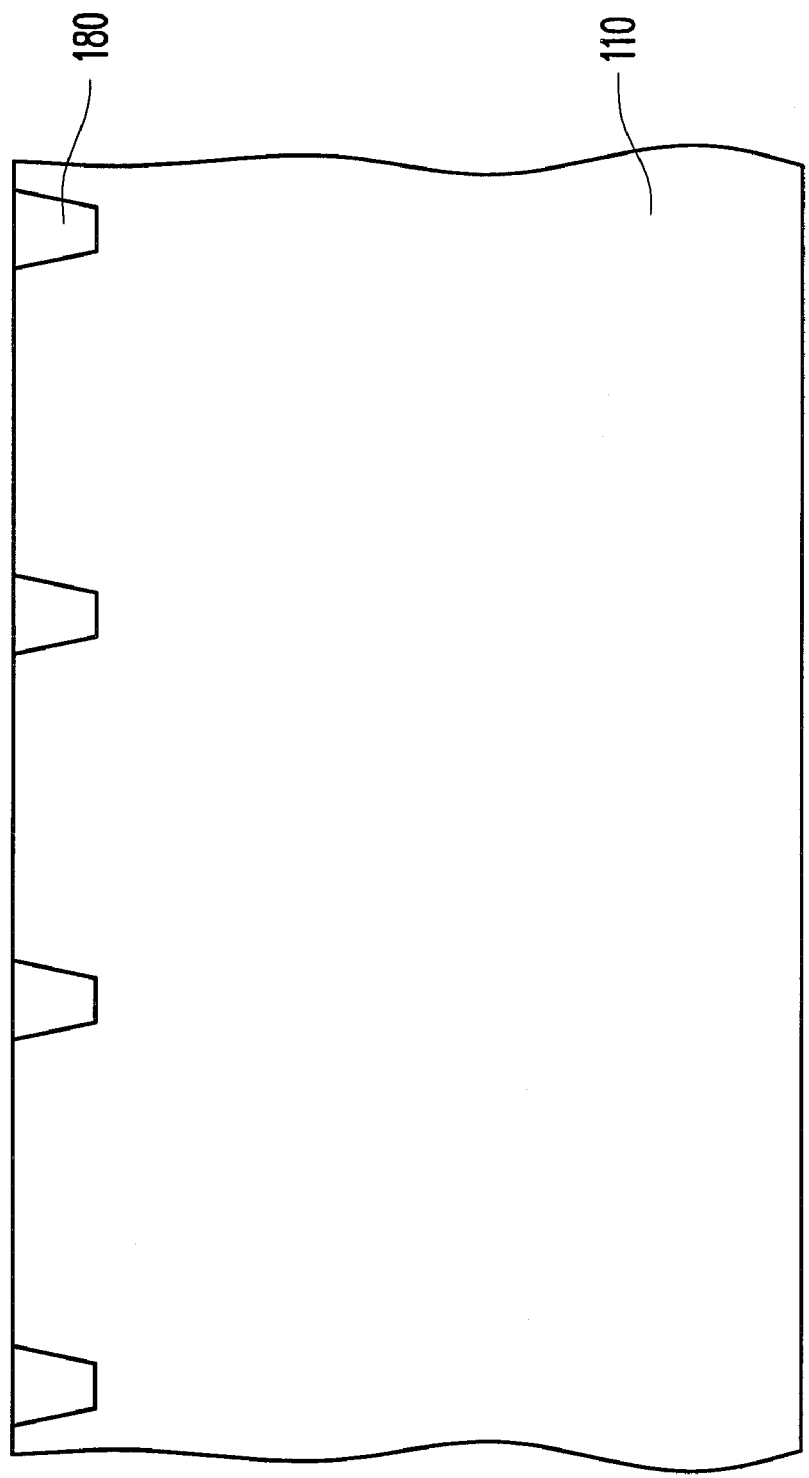
FIG. 3 to FIG. 7 are partial cross-sectional views of a method for manufacturing an image sensor according to an embodiment of the invention.
Figure 4:
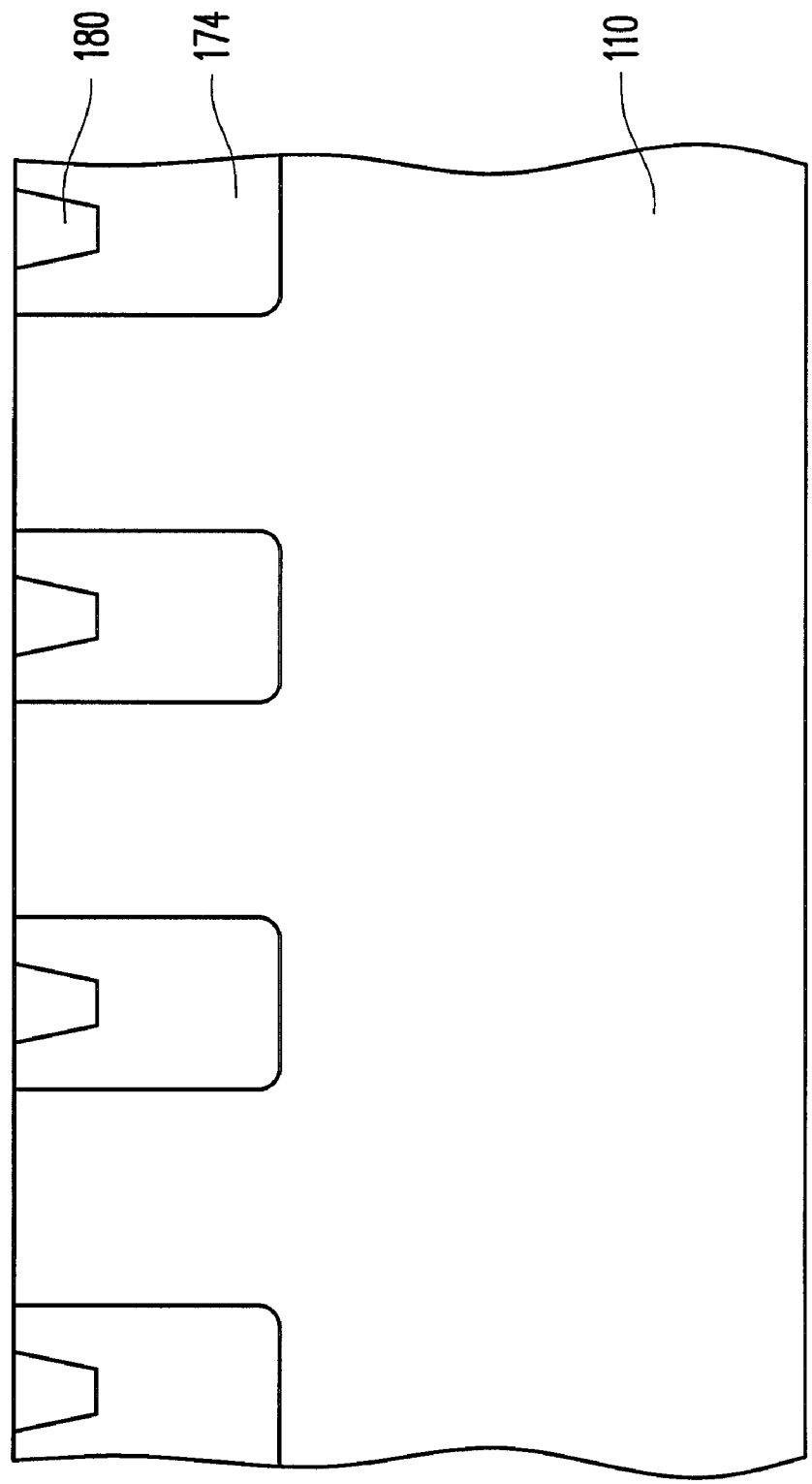
Figure 5:
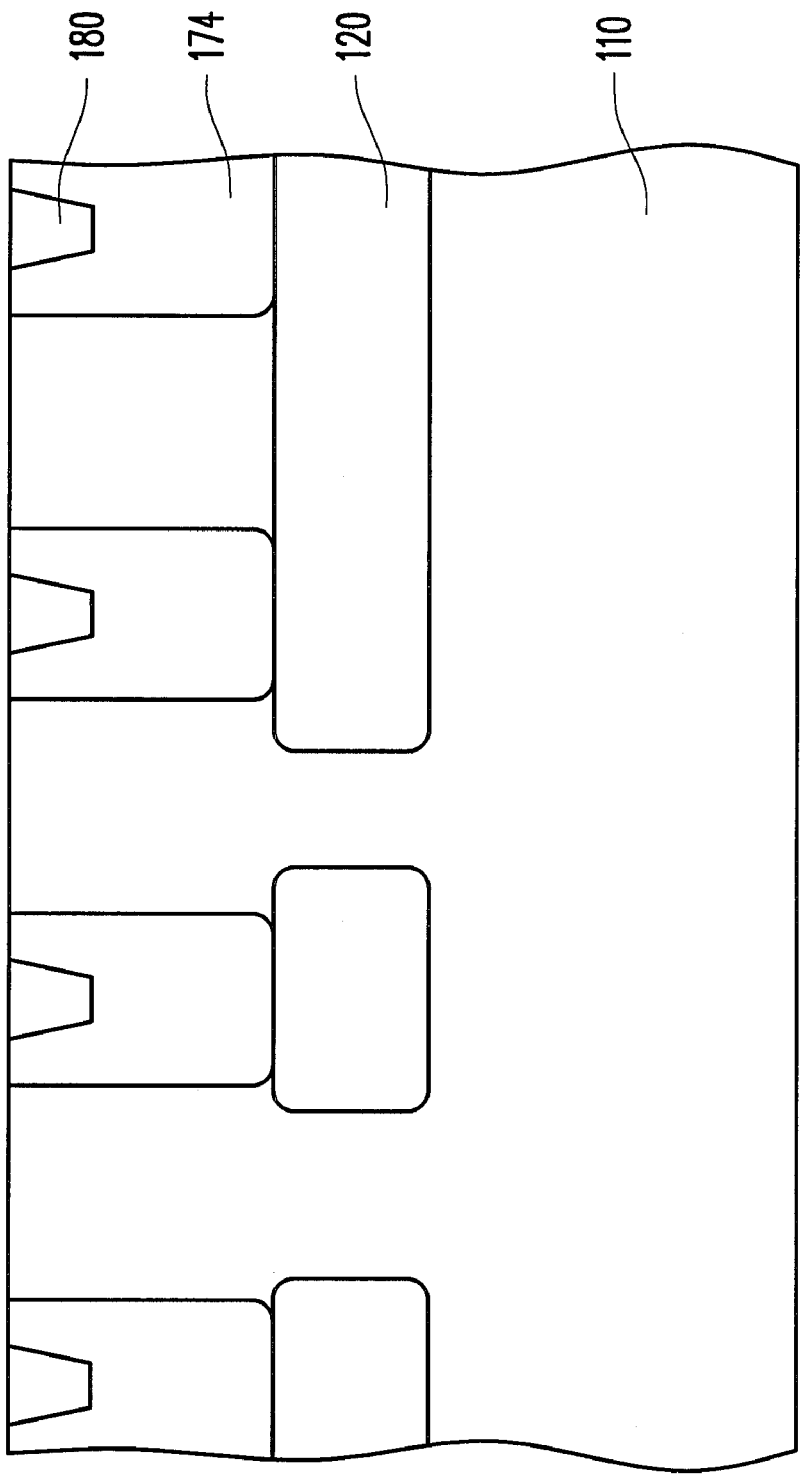
Figure 6:
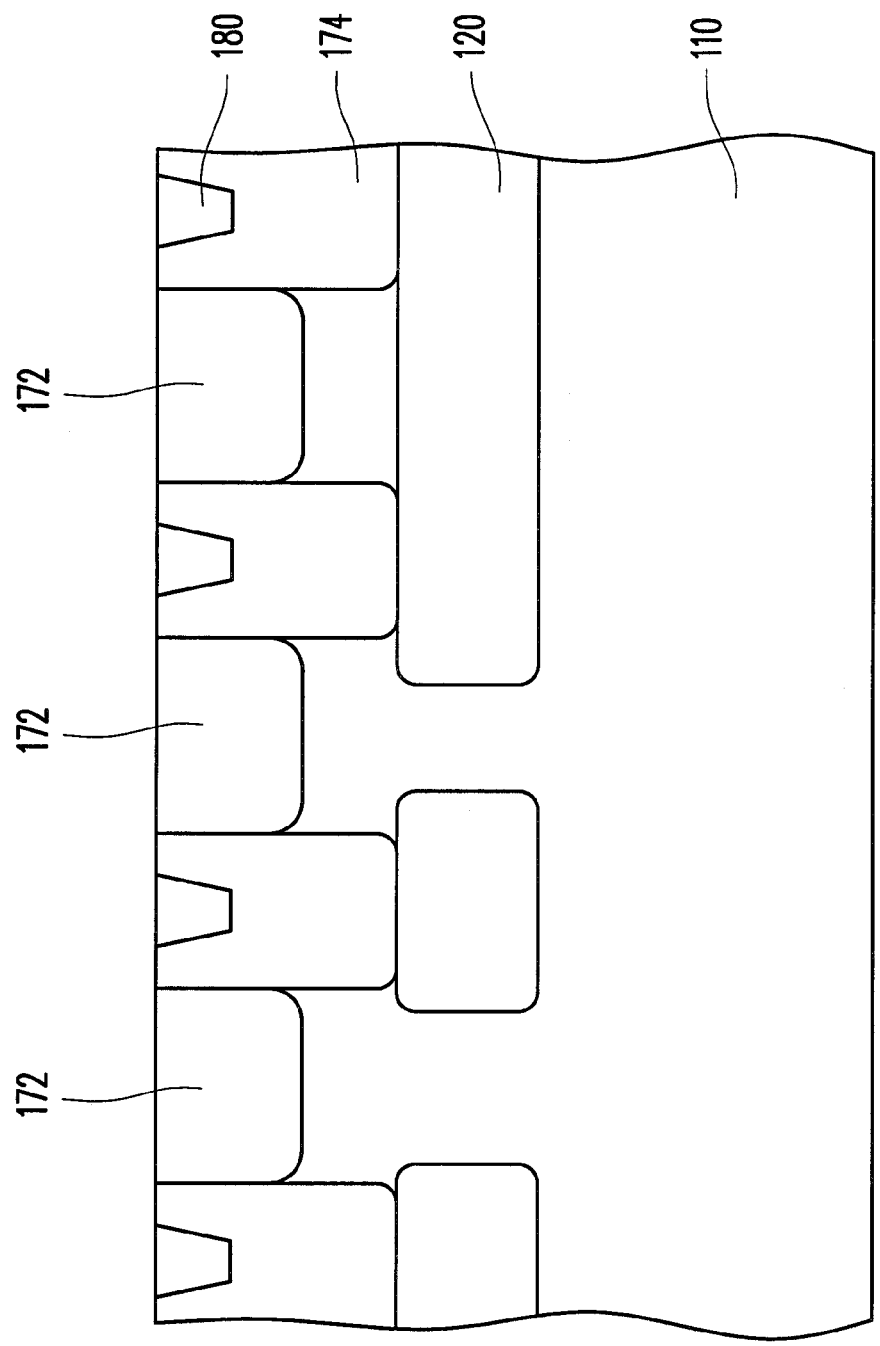
Figure 7:
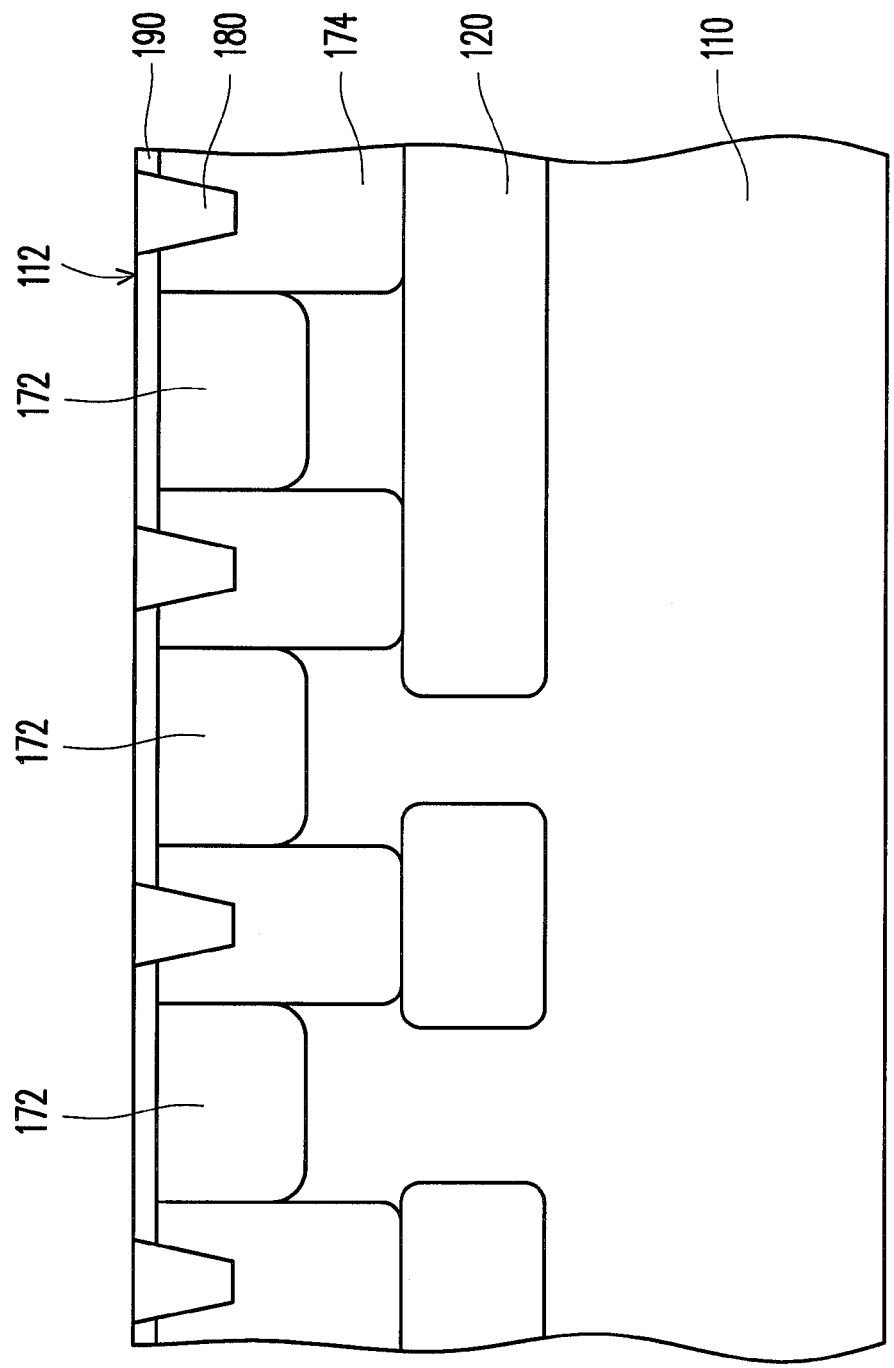

Referring to FIG. 3, a shallow trench isolation structure 180 is formed in the substrate 110 for isolating the first sensing units 130, the second sensing units 140 and the third sensing units 150. Referring to FIG. 4, a plurality of second type doped wells 174 is formed in the substrate 110, and a method of forming the second type doped wells 174 is, for example, to perform a P-type doping process. Referring to FIG. 5, the deep well layer 120 is formed in the substrate 110, and a method of forming the deep well layer 120 is, for example, to perform the P-type doping process. The deep well layer 120 is located under the second type doped wells 174. Referring to FIG. 6, a plurality of first type doped regions 172 is formed between the second type doped wells 174, and a method of forming the first type doped regions 172 is, for example, to perform a N-type ion doping process. Referring to FIG. 7, a surface doped layer 190 is formed on the first surface 112 of the substrate 110. Finally, referring to FIG. 1, the filter layer 160 is disposed on the first surface 112 of the substrate 110.

In summary, in the image sensor of the invention, distributions of the deep well layers under the sensing units are determined according to different features of the sensing units, so as to control a limitation level of the motion of the carriers, and mitigate the cross-talk phenomenon between the sensing units.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An image sensor, comprising:
a substrate, having a first surface;
a deep well layer, located in the substrate;
a plurality of first sensing units, located between the first surface and the deep well layer;
a plurality of second sensing units, located between the first surface and the deep well layer; and
a plurality of third sensing units, located between the first surface and the deep well layer, wherein a ratio between an area of a part of the deep well layer under each first sensing unit and an area of each first sensing unit is a first area ratio, a ratio between an area of a part of the deep well layer under each second sensing unit and an area of each second sensing unit is a second area ratio, and a ratio between an area of a part of the deep well layer under each third sensing unit and an area of each third sensing unit is a third area ratio, and the first area ratio is greater than the second area ratio and the third area ratio.

2. The image sensor as claimed in claim 1, wherein a sensing wavelength of the first sensing unit is smaller than a sensing wavelength of the second sensing unit and a sensing wavelength of the third sensing unit.

3. The image sensor as claimed in claim 1, wherein the second area ratio is greater than the third area ratio.

4. The image sensor as claimed in claim 3, wherein the sensing wavelength of the second sensing unit is smaller than the sensing wavelength of the third sensing unit.

5. The image sensor as claimed in claim 1, further comprising a filter layer disposed on the first surface of the substrate, wherein the filter layer has a plurality of first filter units, a plurality of second filter units and a plurality of third filter units, each of the first filter units is located above one of the first sensing units, each of the second filter units is located above one of the second sensing units, and each of the third filter units is located above one of the third sensing units.

6. The image sensor as claimed in claim 5, wherein the first filter units are pervious to blue light, the second filter units are pervious to green light, and the third filter units are pervious to red light.

7. The image sensor as claimed in claim 1, wherein the first area ratio is 1.

8. The image sensor as claimed in claim 1, wherein each of the first sensing units, each of the second sensing units and each of the third sensing units respectively comprise a first type doped region and a plurality of second type doped wells located at two sides of the first type doped region.

9. The image sensor as claimed in claim 8, wherein the first type doped region is a N-type doped region, and the second type doped wells are P-type doped wells.

10. The image sensor as claimed in claim 9, wherein the deep well layer is a deep P-type doped well layer.

11. The image sensor as claimed in claim 8, wherein any two of the adjacent first sensing units, the second sensing units and the third sensing units share one of the second type doped wells.

12. The image sensor as claimed in claim 1, further comprising a shallow trench isolation structure located in the substrate for isolating the first sensing units, the second sensing units and the third sensing units.

13. The image sensor as claimed in claim 1, wherein the deep well layer is distributed under the first sensing units in a dot distribution.

14. The image sensor as claimed in claim 1, wherein the deep well layer comprises a plurality of strip parts parallel to each other.

15. The image sensor as claimed in claim 1, wherein the deep well layer has a mesh shape, and the first sensing units, the second sensing units and the third sensing units are located above a plurality of meshes of the deep well layer.

16. The image sensor as claimed in claim 1, further comprising a surface doped layer located on the first surface of the substrate.

* * * * *